(12) United States Patent
Cerny et al.

(10) Patent No.: US 8,448,109 B1
(45) Date of Patent: May 21, 2013

(54) VECTOR EVALUATION OF ASSERTIONS

(75) Inventors: Eduard Cerny, Worcester, MA (US); Surrendra A. Dudani, Newton, MA (US); Samik Sengupta, Northborough, MA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/363,204

(22) Filed: Jan. 31, 2012

(51) Int. Cl.
*G06F 17/50* (2006.01)

(52) U.S. Cl.
USPC ............. 716/106; 716/101; 716/107; 703/14

(58) Field of Classification Search
USPC .............................. 716/101, 106–107; 703/14
See application file for complete search history.

(56) References Cited

U.S. PATENT DOCUMENTS

| | | | | |
|---|---|---|---|---|
| 6,304,892 B1* | 10/2001 | Bhoj et al. | ..................... | 709/202 |
| 7,143,373 B2* | 11/2006 | Moorby | ..................... | 716/106 |
| 7,454,727 B1* | 11/2008 | Cerny et al. | ..................... | 716/106 |
| 7,509,605 B2* | 3/2009 | Baumgartner et al. | ........ | 716/106 |
| 7,711,536 B2* | 5/2010 | McNamara | ..................... | 703/14 |
| 7,810,056 B1* | 10/2010 | Garg et al. | ..................... | 716/104 |
| 8,161,439 B2* | 4/2012 | Lim et al. | ..................... | 716/106 |
| 2004/0117746 A1* | 6/2004 | Narain et al. | ..................... | 716/4 |
| 2006/0085774 A1* | 4/2006 | Moorby | ..................... | 716/5 |
| 2008/0082946 A1* | 4/2008 | Zilic et al. | ..................... | 716/5 |
| 2009/0204931 A1* | 8/2009 | Lim et al. | ..................... | 716/5 |

* cited by examiner

*Primary Examiner* — Naum Levin
(74) *Attorney, Agent, or Firm* — Park, Vaughan, Fleming & Dowler, LLP; Laxman Sahasrabuddhe

(57) ABSTRACT

Systems and techniques for evaluating assertions during circuit verification are described. During operation, m semantically equivalent assertions can be identified, wherein each of the m semantically equivalent assertions is evaluated using n logical expressions. Next, a set of vectors based on the m semantically equivalent assertions can be determined, wherein each vector element corresponds to a logical expression that is used for evaluating one of the m semantically equivalent assertions. The m semantically equivalent assertions can then be evaluated, in parallel, using the set of vectors.

21 Claims, 4 Drawing Sheets

Identifying *m* semantically equivalent assertions, wherein each of the *m* semantically equivalent assertions is evaluated using *n* variables
202

↓

Determining a set of vectors based on the *m* semantically equivalent assertions, wherein each vector element corresponds to a logical expression that is used for evaluating one of the *m* semantically equivalent assertions
204

↓

Evaluating the *m* semantically equivalent assertions using the set of vectors
206

```
    ┌ bit ck, a, b, c, d; bit [1:2] temp1, temp2;
404 ┤
    └ assign temp1 = {a, c}; assign temp2 = {b, d};

406 ── bit state [1:2] [1:2]; event e[2];

┌ always @ck begin
    │   state[2] = state[1] & ~temp2;
    │   state[1] = temp1;
408 ┤   if (state[2][1]) -> e[1];
    │   if (state[2][2]) -> e[2];
    └ end 410 ┌ TA1: assert property(@e[1] 1'b0);
    └ TA2: assert property(@e[2] 1'b0);
```

VECTOR EVALUATION OF ASSERTIONS

BACKGROUND

1. Technical Field

This disclosure relates to electronic design automation (EDA). More specifically, this disclosure relates to parallel evaluation of temporal assertions during property verification by formal means or by simulation.

2. Related Art

The importance of circuit verification cannot be over-emphasized. Indeed, without circuit verification it would have been impossible to design complicated integrated circuits which are commonly found in today's computing devices.

One form of verification typically uses two types of logical expressions: assumptions and assertions. Assumptions are logical expressions that are used primarily in formal verification to model the runtime environment of a design-under-verification (DUV) by constraining the input sequences to only those that are legally allowed to be provided to the DUV. Without assumptions, the DUV may not be constrained to legal behavior, and the assertions being verified may be incorrectly falsified. Assertions are logical expressions that define the desired behavior of the DUV. For example, in some approaches, a circuit is simulated, and during the simulation, a set of assertions is evaluated to verify that the circuit is functioning correctly.

SUMMARY

Some embodiments described herein provide systems and techniques for improving performance of assertion evaluation during design verification.

In some embodiments described herein, m semantically equivalent assertions are identified, wherein each of the m semantically equivalent assertions is evaluated using n logical expressions. Next, a set of vectors based on the m semantically equivalent assertions is determined, wherein each vector element corresponds to a logical expression that is used for evaluating one of the m semantically equivalent assertions. The m semantically equivalent assertions can then be evaluated, in parallel, using the set of vectors. In some embodiments, evaluating the m semantically equivalent assertions using the set of vectors can comprise performing vector operations on the set of vectors.

In some embodiments, the semantically equivalent assertions can be combinational assertions or temporal assertions.

In some embodiments, identifying m semantically equivalent assertions can comprise identifying m instantiations of a combinational property or a temporal property.

In some embodiments, identifying m semantically equivalent assertions can comprise identifying m syntactically similar assertions.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
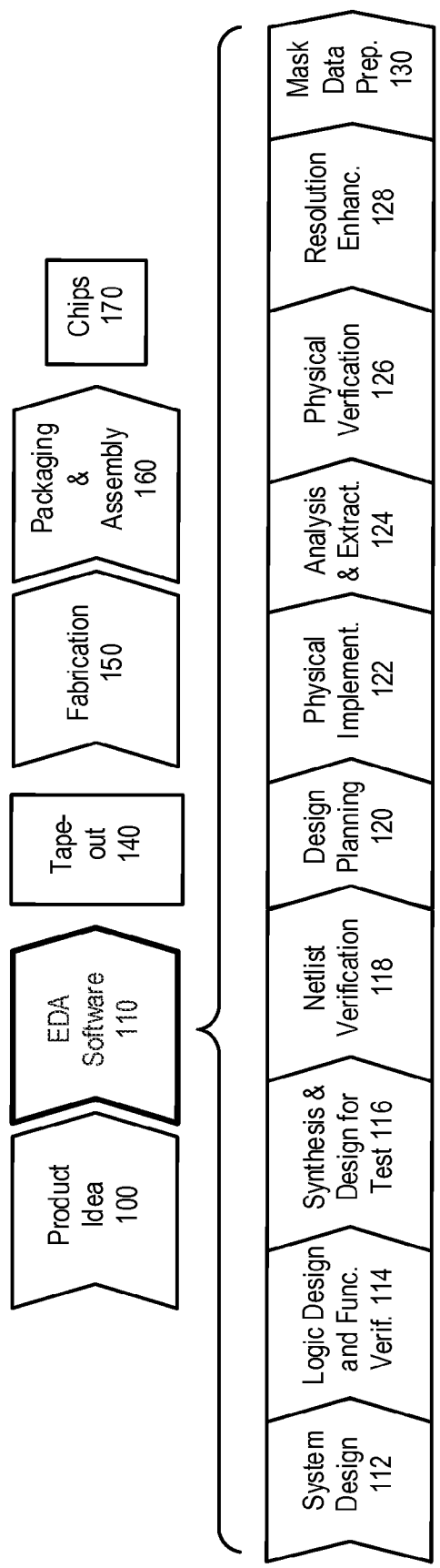
FIG. 1 illustrates various stages in the design and fabrication of an integrated circuit.

FIG. 1 illustrates various stages in the design and fabrication of an integrated circuit.

The process can start with a product idea (step 100) which can be realized using an integrated circuit that is designed using an EDA software (step 110). After the integrated circuit design is finalized, it can undergo a fabrication process (step 150) and a packaging and assembly process (step 160) to produce chips 170.

The EDA process (step 110) comprises steps 112-130, which are described below for illustrative purposes only and are not meant to limit the present invention. Specifically, the steps may be performed in a different sequence than the sequence described below.

During system design (step 112), circuit designers can describe the functionality that they want to implement. They can also perform what-if planning to refine functionality, check costs, etc. Hardware-software architecture partitioning can also occur at this stage. During logic design and functional verification (step 114), the HDL (hardware description language), e.g., SystemVerilog, code for modules in the system can be written and the design can be checked for functional accuracy, e.g., the design can be checked to ensure that it produces the correct outputs.

During synthesis and design for test (step 116), the HDL code can be translated to a netlist. Further, the netlist can be optimized for the target technology, and tests can be designed and implemented to check the finished chips. During netlist verification (step 118), the netlist can be checked for compliance with timing constraints and for correspondence with the HDL code.

During design planning (step 120), an overall floorplan for the chip can be constructed and analyzed for timing and top-level routing. During physical implementation (step 122), circuit elements can be positioned in the layout (placement) and can be electrically coupled (routing).

During analysis and extraction (step 124), the circuit's functionality can be verified at a transistor level and parasitics can be extracted. During physical verification (step 126), the design can be checked to ensure correctness for manufacturing, electrical issues, lithographic issues, and circuitry.

During resolution enhancement (step 128), geometric manipulations can be performed on the layout to improve manufacturability of the design. During mask data preparation (step 130), the design can be "taped-out" to produce masks which are used during fabrication.

Assertions can be categorized into two types: combinational assertions and temporal assertions. (Temporal assertions are sometimes referred to as sequential assertions.)

According to one definition, a combinational assertion is a logical expression that is evaluated using the current values of one or more variables. A combinational assertion can be used to describe a logical relationship between variables that must always hold, i.e., the logical relationship is an invariant that must be true in every clock tick. According to one definition, a clock tick is the smallest unit of time in which the digital state of the circuit can change. For example, a clock tick can correspond to a clock cycle if the circuit can change its digital state at every positive clock edge of the clock.

A combinational property is an abstraction of a combinational assertion. Specifically, a combinational property can be viewed as a template for defining combinational assertions. Stated differently, a combinational assertion is an instantiation of a combinational property.

According to one definition, a temporal assertion is a logical expression that is evaluated using the values of one or more variables, wherein at least one variable value is evaluated at a clock tick that is different from the current clock tick. A temporal assertion can be used to describe a behavior of the DUV that spans multiple clock ticks.

A temporal property is an abstraction of a temporal assertion. Specifically, a temporal property can be viewed as a template for defining temporal assertions. Stated differently, a temporal assertion is an instantiation of a temporal property.

An example of a temporal property and two temporal assertions expressed in SystemVerilog language is shown below:
property p(x,y); @ck x |=>y; endproperty
TA1: assert property(p(a,b));
TA2: assert property(p(c,d));

In the above example, the first line defines temporal property p which is defined over logical expressions x and y. According to one definition, a logical expression can generally be any expression that evaluates to a true or false value. The second line instantiates temporal property p as temporal assertion TA1, wherein logical expression x is the variable a, and logical expression y is the variable b. The third line instantiates temporal property p as temporal assertion TA2, wherein logical expression x is the variable c, and logical expression y is the variable d.

Temporal property p can be described as follows: if x evaluated to true in the current clock tick, then y must evaluate to true in the next clock tick. Temporal property p can equivalently be described as follows: if y evaluates to false in the next clock tick, then x must have evaluated to false in the current clock tick. The following is a truth table for property p.

| x | y | p |
|---|---|---|
| F | F | T |
| F | T | T |
| T | F | F |
| T | T | T |

In the above truth table, columns x, y, and p refer to the values of logical expressions x in the current clock tick, y in the next clock tick, and p in the next clock tick, respectively. As shown in the above truth table, property p is false in the next clock tick only when x is true in the current clock tick and y is false in the next clock tick. Since assertion TA1 is an instantiation of property p, therefore assertion TA1 is false in the next clock tick only when variable a is true (e.g., has a value "1") in the current clock tick and variable b is false (e.g., has a value "0") in the next clock tick. The same can also be said, mutatis mutandis, for assertion TA2.

The above example has been provided for illustration purposes only. A combinational property and a combinational assertion can generally include arbitrarily complex logical expressions. A temporal property and a temporal assertion can generally include arbitrarily complex logical expressions that span one or more clock ticks.

Assertion evaluation can take up a significant amount of the verification run time. Therefore, it is desirable to improve performance of assertion evaluation. Some embodiments described herein provide systems and techniques for improving the performance of assertion evaluation. The following paragraphs first define a few terms, and then describe some embodiments for improving the performance of assertion evaluation.

According to one definition, two assertions A1 and A2 are semantically equivalent if and only if there exists a mapping between the logical expressions of assertion A1 and the logical expressions of assertions A2 such that replacing the logical expressions of assertion A1 by the corresponding logical expressions of assertion A2, or replacing the logical expressions of assertion A2 by the corresponding logical expressions of assertion A1 causes the two assertions to be logically equivalent. According to one definition, two assertions are logically equivalent if the two assertions evaluate to the same value under all possible variable assignments.

For example, in the example shown above, temporal assertions TA1 and TA2 are semantically equivalent because replacing variables a and b in TA1 with variables c and d, respectively, or replacing variables c and d in TA2 with variables a and b, respectively, causes the assertions to be logically equivalent.

According to one definition, two assertions are syntactically equivalent if and only if they have the same syntactic structure. Since an assertion is a logical expression, the assertion can be represented as a parse tree that represents the syntactic structure of the assertion. According to one definition, two assertions are syntactically equivalent if and only if the corresponding parse trees are isomorphic. Note that internal nodes (i.e., non-leaf nodes) in the parse tree correspond to operators. According to one definition, two parse trees are isomorphic if and only if the corresponding internal nodes under the isomorphism have the same operator. The leaf expressions, on the other hand, can refer to different variables under the isomorphism.

In some embodiments, syntactic equivalence between two assertions can be determined based on comparing canonical representations of the two assertions. For example, an assertion can be parsed to obtain a parse tree. Next, a signature string can be generated from the parse tree, and stored in a signature string database. For example, the parse tree can be traversed in a deterministic fashion (e.g., using depth-first-search with a predetermined node ordering) to create the signature string. If two assertions have the same signature string, then the system can conclude that the two assertions are syntactically equivalent, and therefore, are semantically equivalent. In some embodiments, a hash table can be used to determine whether or not a given signature string exists in the signature string database.

In some embodiments, semantic equivalence between two assertions can be determined using formal verification, e.g., by formally proving that one assertion is equivalent to another.

Note that syntactic equivalence is a sufficient condition for semantic equivalence. In other words, if two assertions are syntactically equivalent, then they are also semantically equivalent. Therefore, in some embodiments, two assertions can be determined to be semantically equivalent by determining whether or not the two assertions are syntactically equivalent.

In some embodiments, two assertions can be determined to be semantically equivalent by determining whether or not the two assertions are instantiations of the same combinational or temporal property. For example, in the example shown above, temporal assertions TA1 and TA2 are semantically equivalent because they both are instantiations of the same temporal property p.

These approaches for determining semantic equivalence between two assertions have been provided for illustration purposes only, and are not intended to limit the embodiments described herein to the forms disclosed.

Figure 2:
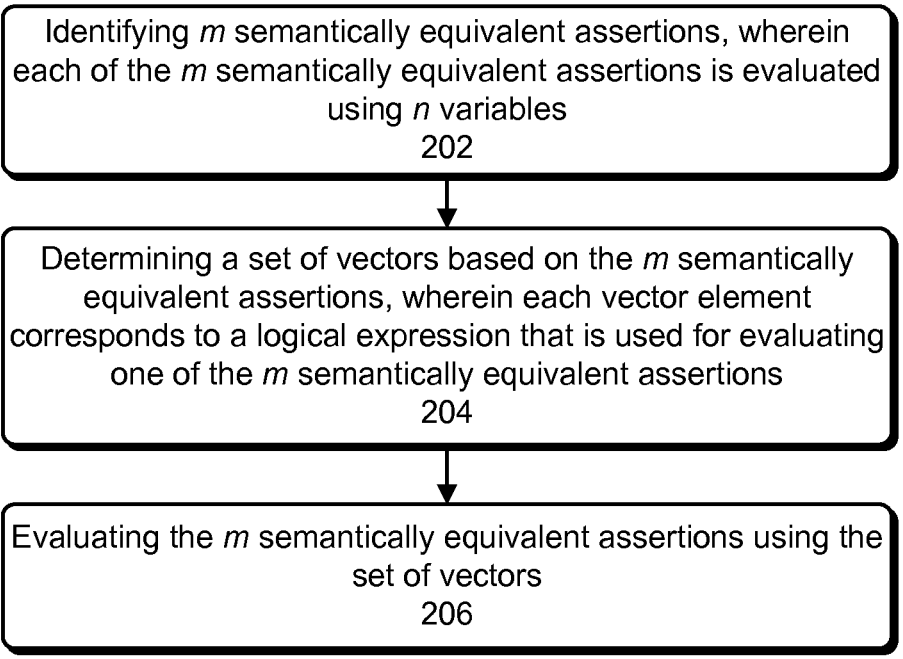
FIG. 2 presents a flowchart that illustrates a process for evaluating assertions in accordance with some embodiments described herein.

FIG. 2 presents a flowchart that illustrates a process for evaluating assertions in accordance with some embodiments described herein.

The process can begin by identifying m semantically equivalent assertions, wherein each of the m semantically equivalent assertions is evaluated using n logical expressions (operation 202).

Next, a set of vectors can be determined based on the m semantically equivalent assertions, wherein each vector element corresponds to a logical expression that is used for evaluating one of the m semantically equivalent assertions (operation 204).

The m semantically equivalent assertions can then be evaluated using the set of vectors (operation 206). In some embodiments, the system can evaluate the m semantically equivalent assertions in parallel by performing vector operations on the set of vectors.

According to one definition, a vector operation is as an operation that is performed on one or more vectors. Each element of the vector can be one or more bits in length. For example, a 64-bit word can be considered to be a vector that has 64 1-bit vector elements. Many general purpose processors support instructions that perform bitwise logical operations on the operands (e.g., bitwise "AND" and "OR" operations). Since an operand for a bitwise logical operation can be considered to be a bit vector (e.g., a vector with 64 1-bit vector elements if the operand is a 64-bit word), a general purpose processor is capable of performing vector operations according to the definition of the term "vector operation" that is used in this disclosure. Some processors (sometimes called vector processors or array processors) are specifically designed to perform operations on vectors, and such processors can also be used in some embodiments described herein.

Figure 3:
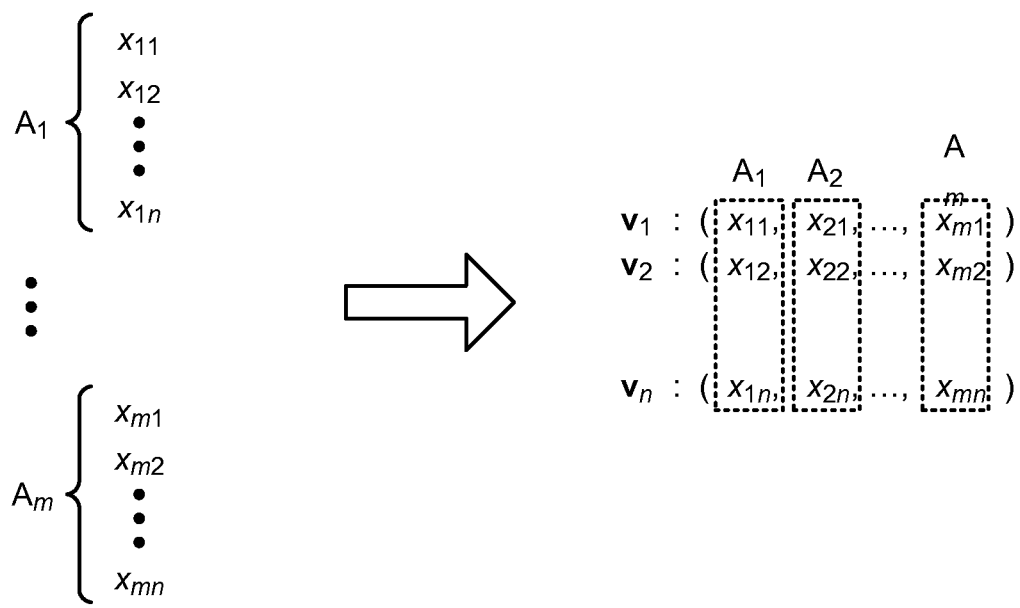
FIG. 3 illustrates how a set of vectors can be determined based on semantically equivalent assertions in accordance with some embodiments described herein.

FIG. 3 illustrates how a set of vectors can be determined based on m semantically equivalent assertions in accordance with some embodiments described herein.

Let assertions $A_1, A_2, \ldots, A_m$ be semantically equivalent assertions. Without loss of generality, let assertion $A_i$ be evaluated using logical expressions $x_{i1}, x_{i2}, \ldots x_{in}$, e.g., let assertion $A_1$ be evaluated using logical expressions $x_{11}$, $x_{12}, \ldots, x_{in}$, assertion $A_2$ be evaluated using logical expressions $x_{21}, x_{22}, \ldots, x_{2n}$, etc., and assertion $A_m$ be evaluated using logical expressions $x_{m1}, X_{m2}, \ldots, X_{mn}$.

Without loss of generality, let logical expression $x_{ik}$ in assertion $A_i$ correspond to logical expression $x_{jk}$ in assertion $A_j$. In other words, let logical expressions $x_{11}, x_{21}, \ldots, x_{m1}$ correspond to one another, let logical expressions $x_{12}$, $x_{22}, \ldots, x_{m2}$ correspond to one another, and so forth. The correspondence between logical expression $x_{ik}$ in assertion $A_i$ and logical expression $x_{jk}$ in assertion $A_j$ is with respect to the operations that are performed while evaluating assertions $A_i$ and $A_j$, i.e., if a particular operation (e.g., say a logical "AND") is performed on $x_{ik}$ while evaluating assertion $A_i$, then the same operation will be performed on $X_{jk}$ while evaluating assertion $A_j$.

FIG. 3 illustrates how vectors $v_1, v_2, \ldots, v_n$ can be determined based on assertions $A_1, A_2, \ldots, A_m$. Specifically, $v_1=(x_{11}, x_{21}, \ldots, x_{m1})$, $v_2=(x_{12}, X_{22}, \ldots, x_{m2}), \ldots$, and $v_n=(x_{1n}, x_{2n}, \ldots, x_{mn})$.

Once vectors $v_1, v_2, \ldots, v_n$ are determined, assertions $A_1$, $A_2, \ldots, A_m$ can be evaluated in parallel by performing vector operations on vectors $v_1, v_2, \ldots, v_n$. The reason why these assertions can be evaluated in parallel using vector operations is that assertions $A_1, A_2, \ldots, A_m$ are semantically equivalent, and therefore they can be evaluated by performing the same sequence of operations on the corresponding logical expressions.

For example, suppose in a given clock tick, evaluating assertion $A_1$ involves performing operation "op" on logical expressions $x_{11}$ and $x_{12}$, then in the same clock tick, evaluating assertion $A_2$ will involve performing the same operation "op" on logical expressions $x_{21}$ and $x_{22}$, and evaluating assertion $A_3$ will involve performing the same operation "op" on logical expressions $x_{31}$ and $x_{32}$, and so forth. For this reason, semantically equivalent assertions $A_1, A_2, \ldots, A_m$ can be evaluated in parallel by performing a vector operation (corresponding to operation "op") on vectors $v_1, v_2, \ldots, v_n$.

The example shown in FIG. 3 was presented for illustration purposes only and is not intended to limit the embodiments described herein to the forms disclosed. Specifically, in the example shown in FIG. 3, n vectors were determined from the logical expressions. In some embodiments, fewer than n vectors may be determined. Specifically, if some of the operations that need to be performed while evaluating an assertion cannot be vectorized because the underlying hardware does not support vectorized operations, then those operations may be performed in a serial fashion. For example, suppose a processor supports bitwise logical operations, but does not support vector addition. Then, additions can be performed serially (i.e., separately for each assertion), whereas logical operations can be performed in parallel. In some embodiments, a vector may include less than m logical expressions. For example, suppose m is equal to 72, and the underlying hardware only supports vector operations on vectors that have up to 64 elements. In this case, two sets of vectors may be determined. The first set of vectors may have 64 elements, and the second set of vectors may have 8 elements.

Figure 4A:
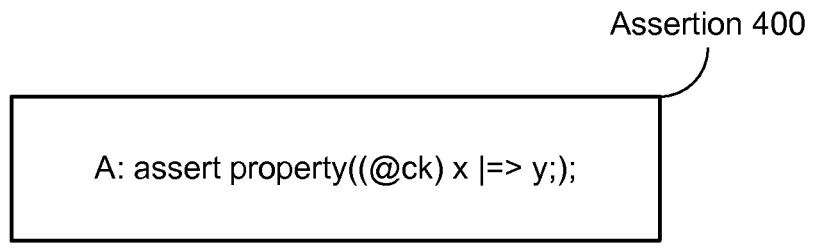
FIGS. 4A-4B illustrate how a finite state automaton (FSA) can be used to evaluate an assertion in accordance with some embodiments described herein.
Figure 4B:
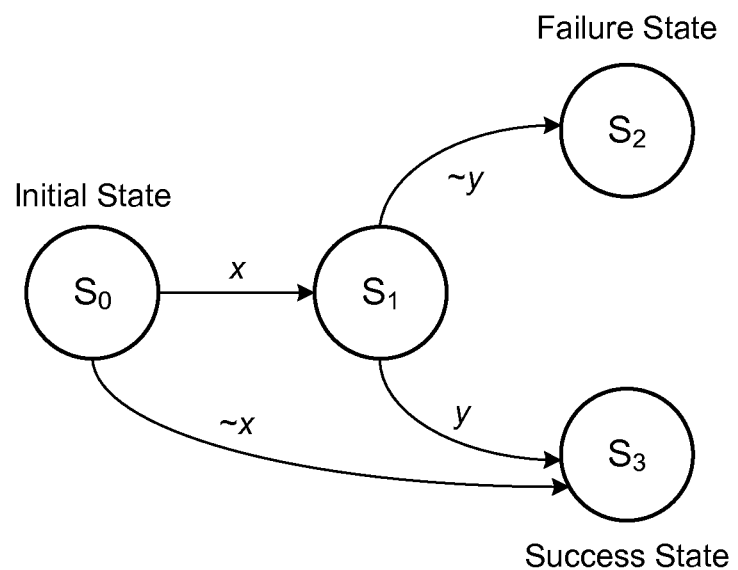

FIGS. 4A-4B illustrate how an FSA can be used to evaluate an assertion in accordance with some embodiments described herein. An assertion can be evaluated using many techniques. The FSA-based evaluation that is illustrated in FIGS. 4A-4B is for illustration purposes only, and is not intended to limit the embodiments disclosed herein to the forms disclosed.

The FSA shown in FIG. 4B models assertion 400 (described in SystemVerilog) shown in FIG. 4A. The FSA includes states $S_0$, $S_1$, $S_2$, and $S_3$. If state $S_3$ is reached, then the assertion evaluates to true, and if state $S_2$ is reached then the assertion evaluates to false.

The FSA starts in state $S_0$. In the current clock tick, if x is true (shown as "x" in the figure), then the FSA transitions to state $S_1$. On the other hand, if x is false (shown as "~x" in the figure), then the FSA transitions to $S_3$, i.e., the assertion evaluates to true. If x is true in the current clock tick, and y is true in the next clock tick, then the FSA transitions to state $S_3$. On the other hand, if x is true in the current clock tick (i.e., x is true), and y is false in the next clock tick (i.e., y is false), then the FSA transitions to state $S_2$.

Figures 4C, 5:
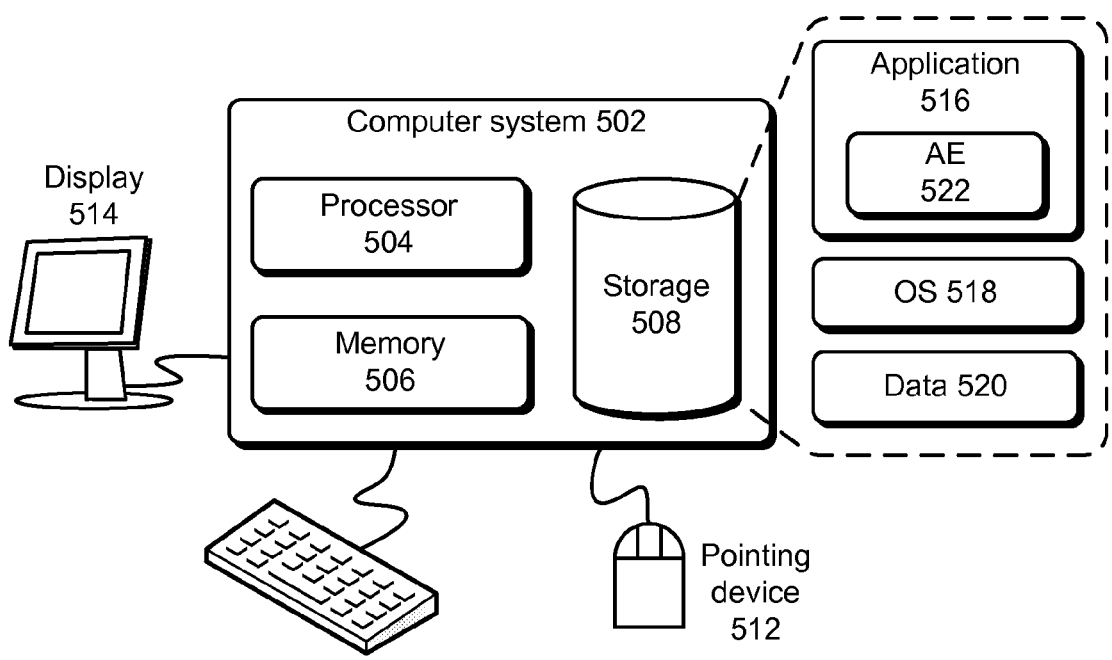
FIG. 4C illustrates how FSA-based implementations of assertions can be evaluated in parallel in accordance with some embodiments described herein.
FIG. 5 illustrates a computer system in accordance with some embodiments described herein.

FIG. 4C illustrates how FSA-based implementations of assertions TA1 and TA2 can be evaluated in parallel in accordance with some embodiments described herein. The HDL code shown in FIG. 4B is for illustration purposes only and is not intended to limit the disclosure to the forms disclosed.

Lines 404 in HDL code 402 define bit arrays temp1 and temp2. Array temp1 stores values of one-bit variables a and c, which correspond to logical expression x in property p(x, y), as described above. Array temp2 stores values of one-bit variables b and d, which correspond to the logical expression y in property p(x, y).

Line 406 defines a two-dimensional array that models the behavior of two FSAs corresponding to temporal assertions TA1 and TA2 that were defined above. Specifically, element state[2][1] indicates whether the FSA corresponding to temporal assertion TA1 reached the failure state $S_2$ (this occurs when the value of state[2][1] is equal to 1), and element state[2][2] indicates whether the FSA corresponding to temporal assertion TA2 reached the failure state $S_2$ (this occurs when the value of state[2][2] is equal to 1). State $S_3$ is not modeled in HDL code 402 because in this embodiment we report only when an assertion fails, not when the assertion succeeds. However, if needed, successes can also be reported using a similar technique. The elements of the event array "e" are triggered when the FSAs corresponding to assertions TA1 and TA2 reach the failure state $S_2$.

Lines 408 execute the FSA at every clock tick. The statement "state[2]=state[1] & ~temp2;" determines if failure state $S_2$ was reached in any of the two FSAs. Specifically, state $S_2$ is reached in the FSA for TA1 if variable a is true in the current clock tick and variable b is false in the next clock tick. Similarly, state $S_2$ is reached in the FSA for TA2 if variable c is true in the current clock tick and variable d is false in the next clock tick. The notation "state[i]" corresponds to a two-bit vector comprising bit values state[i][1] and state[i][2]. The statement "state[1]=temp1;" updates the value of state[1] which can then be used in the next clock tick to determine whether or not failure state $S_2$ is reached in the next clock tick. Event e[1] is triggered when state[2][1] is equal to 1 (i.e., the FSA for TA1 reaches state $S_2$) and event e[2] is triggered when state[2][2] is equal to 1 (i.e., the FSA for TA2 reaches state $S_2$). Lines 410 specify that assertions TA1 and TA2 fail whenever events e[1] and e[2], respectively, are triggered.

Variables a and b, and array elements state[1][1] and state [2][1] are used for evaluating assertion TA1. Similarly, variables c and d, and array elements state[1][2], and state[2][2] are used for evaluating assertion TA2. Temporal assertion TA1 is analogous to assertion $A_1$ in FIG. 3, and variables a and b, and array elements state[1][1] and state [2][1] are analogous to logical expressions $x_{11}$, $x_{12}$, etc. that are used for evaluating assertion $A_1$ in FIG. 3. Similarly, temporal assertion TA2 is analogous to assertion $A_2$, and variables c and d, and array elements state[1][2] and state[2][2] are analogous to logical expressions $x_{21}$, $x_{22}$, etc. that are used for evaluating assertion $A_2$.

Statement "state[2]=state[1] & ~temp2;" performs two vector operations using vector operands state [1] and temp2 and assigns the vector result to vector state[2]. Specifically, the statement performs a bitwise negation operation on vector temp2 followed by a bitwise "AND" operation on vector operands state [1] and temp2, and stores the result in vector state[2]. In other words, the statement "state[2]=state[1] & ~temp2;" executes, in parallel, the FSAs corresponding to assertions TA1 and TA2, and, in doing so, evaluates assertions TA1 and TA2 in parallel.

FIG. 5 illustrates a computer system in accordance with some embodiments described herein.

A computer system can generally be any system that can perform computations. Specifically, a computer system can be a microprocessor with one or more cores, a vector processor, an application specific integrated circuit, a distributed computing system, a cloud computing system, or any other computing system now known or later developed. Computer system 502 comprises processor 504, memory 506, and storage 508. Computer system 502 can be coupled with display 514, keyboard 510, and pointing device 512. Storage 508 can generally be any device that can store data. Specifically, a storage device can be a magnetic, an optical, or a magneto-optical storage device, or it can be based on flash memory and/or battery-backed up memory. Storage 508 can store application 516, operating system 518, and data 520.

Application 516 can include instructions that when executed by computer 502 cause computer 502 to perform one or more processes that are implicitly or explicitly described in this disclosure. Application 516 can include assertion engine 522 which can be capable of evaluating a set of semantically equivalent assertions in parallel. Data 520 can include data that is required by application 516.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for evaluating assertions for verifying a circuit design, the method comprising:
   identifying m semantically equivalent assertions, wherein each of the m semantically equivalent assertions is evaluated using n logical expressions;
   determining a set of vectors based on the m semantically equivalent assertions, wherein each vector element corresponds to a logical expression that is used for evaluating one of the m semantically equivalent assertions; and
   evaluating, by computer, the m semantically equivalent assertions using the set of vectors.

2. The method of claim 1, wherein the semantically equivalent assertions are combinational assertions.

3. The method of claim 1, wherein the semantically equivalent assertions are temporal assertions.

4. The method of claim 1, wherein identifying m semantically equivalent assertions comprises identifying m instantiations of a combinational property.

5. The method of claim 1, wherein identifying m semantically equivalent assertions comprises identifying m instantiations of a temporal property.

6. The method of claim 1, wherein identifying m semantically equivalent assertions comprises identifying m syntactically equivalent assertions.

7. The method of claim 1, wherein evaluating the m semantically equivalent assertions using the set of vectors comprises performing vector operations on the set of vectors.

8. A non-transitory computer-readable storage medium storing instructions that, when executed by a computer, cause the computer to perform a method for evaluating assertions for verifying a circuit design, the method comprising:
   identifying m semantically equivalent assertions, wherein each of the m semantically equivalent assertions is evaluated using n logical expressions;
   determining a set of vectors based on the m semantically equivalent assertions, wherein each vector element corresponds to a logical expression that is used for evaluating one of the m semantically equivalent assertions; and
   evaluating, by computer, the m semantically equivalent assertions using the set of vectors.

9. The non-transitory computer-readable storage medium of claim 8, wherein the semantically equivalent assertions are combinational assertions.

10. The non-transitory computer-readable storage medium of claim 8, wherein the semantically equivalent assertions are temporal assertions.

11. The non-transitory computer-readable storage medium of claim 8, wherein identifying m semantically equivalent assertions comprises identifying m instantiations of a combinational property.

12. The non-transitory computer-readable storage medium of claim 8, wherein identifying m semantically equivalent assertions comprises identifying m instantiations of a temporal property.

13. The non-transitory computer-readable storage medium of claim 8, wherein identifying m semantically equivalent assertions comprises identifying m syntactically equivalent assertions.

14. The non-transitory computer-readable storage medium of claim 8, wherein evaluating the m semantically equivalent assertions using the set of vectors comprises performing vector operations on the set of vectors.

15. A computer, comprising:
   a processor; and
   a non-transitory computer-readable storage medium storing instructions that, when executed by the processor, cause the computer to perform a method for evaluating assertions for verifying a circuit design, the method comprising:
      identifying m semantically equivalent assertions, wherein each of the m semantically equivalent assertions is evaluated using n logical expressions;
      determining a set of vectors based on the m semantically equivalent assertions, wherein each vector element corresponds to a logical expression that is used for evaluating one of the m semantically equivalent assertions; and
      evaluating, by computer, the m semantically equivalent assertions using the set of vectors.

16. The computer of claim 15, wherein the semantically equivalent assertions are combinational assertions.

17. The computer of claim 15, wherein the semantically equivalent assertions are temporal assertions.

18. The computer of claim 15, wherein identifying m semantically equivalent assertions comprises identifying m instantiations of a combinational property.

19. The computer of claim 15, wherein identifying m semantically equivalent assertions comprises identifying m instantiations of a temporal property.

20. The computer of claim 15, wherein identifying m semantically equivalent assertions comprises identifying m syntactically equivalent assertions.

21. The computer of claim 15, wherein evaluating the m semantically equivalent assertions using the set of vectors comprises performing vector operations on the set of vectors.

* * * * *